United States Patent [19]

Miyamoto et al.

[11] Patent Number: 5,683,935
[45] Date of Patent: Nov. 4, 1997

[54] METHOD OF GROWING SEMICONDUCTOR CRYSTAL

[75] Inventors: Yasuaki Miyamoto; Ichirou Asai, both of Ebina, Japan

[73] Assignee: Fuji Xerox Co., Ltd., Tokyo, Japan

[21] Appl. No.: 540,487

[22] Filed: Oct. 10, 1995

[30] Foreign Application Priority Data

Feb. 28, 1995 [JP] Japan ................... 7-040818

[51] Int. Cl.$^6$ ........................... H01L 21/26
[52] U.S. Cl. .................. 437/173; 437/8; 437/174; 437/101; 437/233
[58] Field of Search ................. 437/101, 233, 437/174, 173; 117/8

[56] References Cited

U.S. PATENT DOCUMENTS

| | | |
|---|---|---|
| 4,463,028 | 7/1984 | Laude . |
| 5,352,291 | 10/1994 | Zhang et al. ............... 117/8 |
| 5,373,803 | 12/1994 | Noguchi et al. ............ 117/8 |
| 5,409,867 | 4/1995 | Asano ....................... 437/233 |

FOREIGN PATENT DOCUMENTS

| | | |
|---|---|---|
| 0 450 642 A1 | 10/1991 | European Pat. Off. . |
| 3-125422 | 5/1991 | Japan . |
| 5-102035 | 4/1993 | Japan . |
| 5-175149 | 7/1993 | Japan . |
| 6-97074 | 4/1994 | Japan . |

OTHER PUBLICATIONS

Kumomi, Hideya & Takao Yonehara, "Manipulation of nucleation sites in solid-state Si crystallization", *Appl. Phys. Lett.* 59 (27), 30 Dec. 1991, pp. 3565-3567.

*Primary Examiner*—Charles L. Bowers, Jr.
*Assistant Examiner*—Ramamohan Rao Paladugu
*Attorney, Agent, or Firm*—Oliff & Berridge

[57] ABSTRACT

The first feature of the present invention resides in that in a method of semiconductor crystallization, comprising a characteristic determining step of applying first crystallizing energy to a predetermined area of an amorphous semiconductor thin film to determine the size of an area so as to form a single crystal nucleus on the area; and a polycrystalline semiconductor thin film forming step of forming a polycrystalline semiconductor thin film from the amorphous semiconductor thin film, the polycrystalline semiconductor thin film forming step, comprises: a film forming step of forming an amorphous semiconductor thin film on the surface of a substrate; a first crystallizing step of applying first crystallizing energy at regular intervals on the area having the size determined by the characteristic determining step of the amorphous semiconductor thin film; and a second crystallizing step of applying second crystallizing energy to the amorphous semiconductor thin film to grow the crystal of the amorphous semiconductor thin film from the crystal nucleus formed by the first crystallizing step.

13 Claims, 12 Drawing Sheets

METHOD OF GROWING SEMICONDUCTOR CRYSTAL

BACKGROUND OF THE INVENTION

The present invention relates to a method of semiconductor crystallization and semiconductor fabricating device. More particularly, it relates to fabrication of semiconductor crystal used for thin-film semiconductor devices such as a thin-film transistor element, bipolar element, diode element, resistor element, photo-electric conversion element, and electrodes, wirings, etc.

Generally, a polycrystalline silicon (hereinafter referred to as "poly-Si") thin film, which has an excellent characteristic with higher mobility by two orders of magnitude than an amorphous silicon thin film, permits a high performance thin film Si element to be formed. For example, since it has a characteristic which permits a driving circuit to be formed, and hence it can provide a .thin-film transistor for next generation liquid crystal displays or image sensors. Since it can also be formed on an inexpensive glass substrate, the device can be fabricated at low cost by using a large area glass substrate. For this reason, a technique for forming a more fine-structure high-performance element at high throughput and high yield has been demanded. Particularly, in the case of poly-Si thin film transistor, a poly-Si thin film is an important element constituting an active layer and serves as material for forming an important part such as an electrode and resistor in other elements.

For enhancement of packaging density of LSI, fineness of a semiconductor element has progressed rapidly. With development of fineness, the number of crystal grains included in a poly-crystalline thin film area constituting an element has been decreased. For this reason, variations in the grain sizes or positions of a poly-Si thin film greatly influences on variations in the devices. This decreases uniformity of the device characteristic, thus reducing production yield, which results in high cost. Under such a circumstance, it is very important to control the grain size and position of the poly-Si thin film and selectively form crystal grains.

Traditionally, several methods of selectively forming crystal grains have been proposed in, for example, the Japanese Patent Unexamined Publication Nos. Hei. 3-125, 422, Hei. 5-102,035, Hei. 5-175,149 and Hei. 6-97,074.

For example, as shown in FIGS. 9A to 9C, the Japanese Patent Unexamined Publication No. Hei. 3-125,422 proposes a method for forming poly-Si having a grain size of 1-4 μm by the solid-phase crystallization from amorphous Si, executing selective ion-implantation to make amorphous areas and making the solid-phase crystallization again using the poly-Si areas not subjected to ion-implantation as crystal nuclei.

This method deposits an amorphous Si thin film 2 having a thickness of 100 nm on the surface of a quartz substrate 1, forms a poly-Si thin film 6 having a grain size of 1 to 4 μm by the solid-phase crystallization at 600° C. for 50 hours and patterns resists 12 so that areas each having 1 μm square are left in a matrix of dots at intervals of 10 μm by photolithography (FIG. 9A).

This method ion-implants Si ions to make areas not covered by the resists 12 amorphous to form amorphous areas 13 and uses the poly-Si areas covered by the resists 12 as crystal nuclei (FIG. 9B).

This method further removes the resists 12 and performs the solid-phase crystallization at 590° C. for 120 hours to provide a poly-Si thin film having grain boundaries arranged at intervals of about 10 μm in a matrix of dots and consisting of crystal grains 5 having an average diameter of 10 μm (FIG. 9C).

Although this method can provide a poly-Si film having a large average grain diameter, it requires a poly-Si thin film having a large grain size to form a crystal nucleus of 1 μm, which will deteriorates the throughput.

The use of the glass substrate makes it difficult to reduce the process temperature because the time taken until start of crystallization in the solid-phase crystallization at 500° C. or so is several times as long as that at 600° C.

The crystal grains formed by the solid-phase crystallization are generated at random positions. Therefore, seed areas 19 probably include grain boundaries in such a manner as shown in FIG. 13A that the seed areas 19 each having 1 μm at upper left and lower left have no grain boundaries whereas those at upper right and lower left include grain boundaries.

Thus, because of presence of plural crystal nuclei in the single seed area, the area to be a single crystal grain after the solid-phase crystallization consists of plural crystal grains, which results in greatly different grain sizes.

The Japanese Patent Unexamined Publication No. Hei 5-102,035 proposes a method of laser irradiation using a two-layer film consisting of an amorphous Si film and an SiO2 thin film as a light-shading mask for selectively forming crystal nuclei, as shown in FIGS. 10A to 10D.

Specifically, this method first deposits a first amorphous Si thin film 14 having a thickness of 40 nm on an insulating substrate 1 in which an Si oxide film is deposited on the surface of an Si substrate (FIG. 10A).

Further, this method successively deposits an Si oxide film 15 having a thickness of 500 nm and a second amorphous Si thin film 16 having a thickness of 80 nm. After patterning of an overlying resist layer by photolithography, this method selectively etches the second amorphous Si thin film 16 and the Si oxide thin film 15 to form openings each having a diameter of 0.8 μm and remove the remaining resist. Thus, the method forms a light-shading mask 18 having the second amorphous Si film 16 and the Si oxide thin film 15 (FIG. 10B).

This method executes irradiation of excimer laser to crystallize the first amorphous Si thin film 14 exposed in the openings of the light shading mask 18, thereby forming crystal nuclei 4 (FIG. 10C).

This method etches away the second amorphous Si thin film 16 and Si oxide film 15 used as a light-shading mask and executes the solid-phase crystallization at 600° C. for 40 hours to provide a poly-Si thin film 6 consisting of crystal grains 5 each having a size of several μms (FIG. 10D).

This method, which uses the amorphous Si thin film and Si oxide thin film with the openings as a light shading mask, requires mask formation and removal, which deteriorates the throughput.

The crystallization by laser annealing generally forms a columnar crystal having a grain size several times as large as the film thickness. When the opening having a diameter twenty times as large as the film thickness is used, the crystal nucleus formed in the opening actually results in a poly-crystalline region 20 consisting of plural crystal grains (FIG. 13B).

The long intervals between the openings leads to generation of new crystal which results in variations in the crystal grain size.

The Japanese Patent Unexamined Publication. No. Hei. 5-175,149 proposed, as shown in FIGS. 11A to 11E, a method of crystallizing an amorphous Si film from the solid-phase as it is to form crystal nuclei, selectively leaving the crystal nuclei by liquid phase etching, and thereafter forming the amorphous Si film again to start crystallization from the crystal nuclei.

Specifically, first, this method deposits a first amorphous Si thin film 14 on an insulating substrate 1 (FIG. 11A).

This method makes crystal nuclei 4 having a grain size of 1 μm or so in the first amorphous Si thin film 14 by the solid-phase crystallization at 600° C. for 1 to 2 hours (FIG. 11B).

This method etches the first amorphous Si film 14 from the liquid phase to leave only the crystal nuclei 4 on the surface of the insulating substrate (FIG. 11C). The method deposits a second amorphous thin film 16 on the insulating substrate 1 (FIG. 11D), and executes the solid-phase crystallization for 6–12 hours to provide a poly-Si thin film 6 consisting of crystal grains 5 each having a large grain size of 2–3 μm (FIG. 11E).

This method requires to deposit the amorphous Si thin film twice, thus leading to poor throughput.

This method has also a problem that the crystal grains formed by the solid-phase crystallization are generated at random positions since the positions of the crystal grains are not controlled.

The Japanese Patent Unexamined Publication. No. Hei. 6-97,074 proposed the other method of forming larger crystal nuclei as shown in FIGS. 12A to 12E.

Specifically, this method deposits a poly-Si thin film having a thickness of 100 nm on an insulating substrate 1 and makes it amorphous by ion-implantation to form an amorphous Si film 2. This method patterns resist 12 by photolithography and irradiates predetermined areas not covered by the resist 12 with excimer laser light 3 to form crystal nuclei 4 (FIG. 12A).

This method grow the crystal nuclei 4 to form a poly-Si thin film 6 (FIG. 12B) by the solid phase crystallization at 550°–800° C. for 5–20 hours (FIG. 12B).

This method covers predetermined areas with resist 12 by photolithography and ion-implants to remove unnecessary crystal grains 13 not covered by the resist 12 (FIG. 12C).

This method executes the solid-phase crystallization at 600°–800° C. for 0.5–20 hours to form a poly-Si thin film 6 consisting of crystal grains each having a larger grain size as shown in FIG. 12D.

This method executes the ion-implantation with a smaller irradiation area and poor throughput twice and also executes the photolithography twice. The process is complicated and the throughput is also poor. Adoption of the ion-implantation increases device cost.

In short, these prior arts as described above intend to form a crystal grain having a larger size than the device size which requires a complicated process, thereby deteriorating the throughput.

Thin-film transistors used in a liquid crystal display generally have a device size of several μm to several tens μm. It is actually impossible to make a crystal grain completely covering such a device so that the device must be comprised of plural crystal grains. This increases variations in the number of crystal grains.

A large-area device such as a liquid crystal display requires a glass substrate to be used. In view of the strain temperature of the glass, the maximum temperature of process is desired to be lower than 500° C. In order to execute the solid-phase crystallization of an amorphous Si thin film at 500° C., annealing for several tens to several hundreds of hours is required. This is not practical. This is attributed to the fact that at lower temperatures, a much longer latent time required until generation of crystal nuclei is required. For this reason, in the first and third prior arts shown in FIGS. 9 and 11, lowering the temperature of the process cannot improve the throughput.

SUMMARY OF THE INVENTION

The present invention has been accomplished under the above circumstance. An object of the present invention is to provide a method of a semiconductor crystal which can form crystal nuclei forming a single crystal with a small number of man-hours and good throughput and can provide a poly-Si thin film with high uniformity of grain sizes at a high yield by arranging crystal nuclei at fine intervals to prevent unnecessary crystal nuclei from being generated during crystallization to vary crystal grain sizes.

The first feature of the present invention resides in that in a method of semiconductor crystallization, comprising:

a characteristic determining step of applying first crystallizing energy to a predetermined area of an amorphous semiconductor thin film to determine the size of an area so as to form a single crystal nucleus on the area; and a polycrystalline semiconductor thin film forming step of forming a polycrystalline semiconductor thin film from the amorphous semiconductor thin film, the polycrystalline semiconductor thin film forming step, comprises:

a film forming step of forming an amorphous semiconductor thin film on the surface of a substrate;

a first crystallizing step of applying the first crystallizing energy at regular intervals on the area having the size determined by the characteristic determining step of the amorphous semiconductor thin film; and a second crystallizing step of applying the second crystallizing energy to the amorphous semiconductor thin film to crystallize the amorphous semiconductor thin film from the crystal nucleus formed by the first crystallizing step.

Preferably, the grain size of each of the crystal nuclei formed by the first crystallizing step is 0.5 to 5 times as large as the thickness of the amorphous semiconductor thin film, and the interval of the areas to which the first crystallizing energy is applied is 3 μm or less. It should be noted that the grain size usually means a longer diameter of the grain.

Preferably, the first crystallizing energy is laser light energy.

Preferably, the laser light has a spacial intensity distribution shaped by interference and the area having a desired size of the amorphous semiconductor thin film can be selectively irradiated with energy at desired intervals.

Preferably, the second crystallizing step is performed by irradiation of energy light.

Preferably, the second step is a solid-phase crystal growth step by heat treatment.

Preferably, the second crystallizing step includes a solid-phase crystallization step by heat treatment and an irradiation step of energy light.

The second feature of the present invention resides in that in a method of semiconductor crystallization, comprising:

a film forming step of forming amorphous semiconductor thin film on the surface of a substrate;

a first step of applying first crystallizing energy to the amorphous semiconductor thin film to form a crystal nucleus; and a second step of applying second crystallizing energy to the amorphous semiconductor thin film to crystallize the amorphous semiconductor thin film, wherein the first step is a step of applying the first crystallizing energy to form the crystal nuclei having different desired intervals on the amorphous semiconductor thin film, and the second step is a step of applying the second crystallizing energy to crystallize from the crystal nuclei having different intervals formed by the first step so that semiconductor crystal having different crystal grain sizes for each area are formed.

Preferably, the first step is a step of irradiating laser light having a spacial intensity distribution shaped by interference and capable of selectively irradiating the area having a desired size of the amorphous semiconductor thin film with energy at desired intervals.

The feature of the present invention resides in that a semiconductor fabricating device, comprises:

a substrate supporting means on which a substrate to be processed is placed;

a laser radiating means onto which a plurality of laser beams is radiated to the surface of the substrate to be processed; and an interference optical system adapted to shape the spacial intensity distribution of the laser beam emitted from the laser radiating means so that the region having a desired size on the substrate to be processed is irradiated with energy at desired intervals.

In accordance with the present invention, the size of the area constituting a crystal nucleus is determined on the basis of the thickness of an amorphous semiconductor thin film so as to form a single crystal nucleus for each area. For this reason, in the first crystallizing step, crystal nuclei each constituting a single crystal grain can formed at high throughput. By arranging the crystal nuclei at fine intervals, generation of new nuclei in the second crystallizing step can be prevented, thus providing very uniform semiconductor crystal consisting of crystal grains consisting of equal grain sizes and arranged at regular intervals.

Preferably, the size of crystal nucleus in the first step is 0.5 to 5 times as large as the thickness of the amorphous semiconductor thin film. If it is smaller than 0.5 times, in the second crystallizing step, plural crystal nuclei or crystal grains containing much crystal defect may be generated. If it is larger than 5 times, two or more crystal nuclei will be generated in the single area, which makes it impossible to crystallize large crystal because of grain boundaries. Further, preferably, the size of the crystal nucleus is substantially equal to the thickness of the amorphous semiconductor thin film. When the interval between the crystal grains exceeds 3 µm, crystal cannot be crystallized without generation of a new crystal nucleus in an adjacent area. This hinders smooth crystallization.

Incidentally, it is efficient to form crystal at intervals which are larger than the grain size of the crystal nuclei generated.

Irradiation of laser light permits good crystal nuclei to be created at good controllability for a very short time.

The spacial intensity distribution of the laser light can be easily adjusted by the interference of the laser light. This permits a crystal nucleus having a desired size to be formed very easily at desired intervals.

The use of the laser light in the second crystallizing step permits good crystallinity to be obtained at high throughput. But this may lead to a slight variation in crystallinity for each area as compared with the solid-phase crystallization.

The solid-phase growth permits a large amount of crystallization to be uniformly treated.

Irradiation of energy light after the solid-phase crystallization removes crystal defects so that very uniform semiconductor crystal with good crystallinity can be obtained. In accordance with the second feature of the present invention, poly-Si areas with different grain sizes for different areas can be easily obtained, thus permitting the mobility to be adjusted for each area. This enables devices with the same size but different characteristics to be fabricated.

In accordance with the third feature of the present invention, tie direction of laser irradiation has only to be adjusted to adjust the diameter of beams and its density at good controllability.

DETAILED DESCRIPTION OF THE PREFERRED EMBODIMENT

Figure 1A:
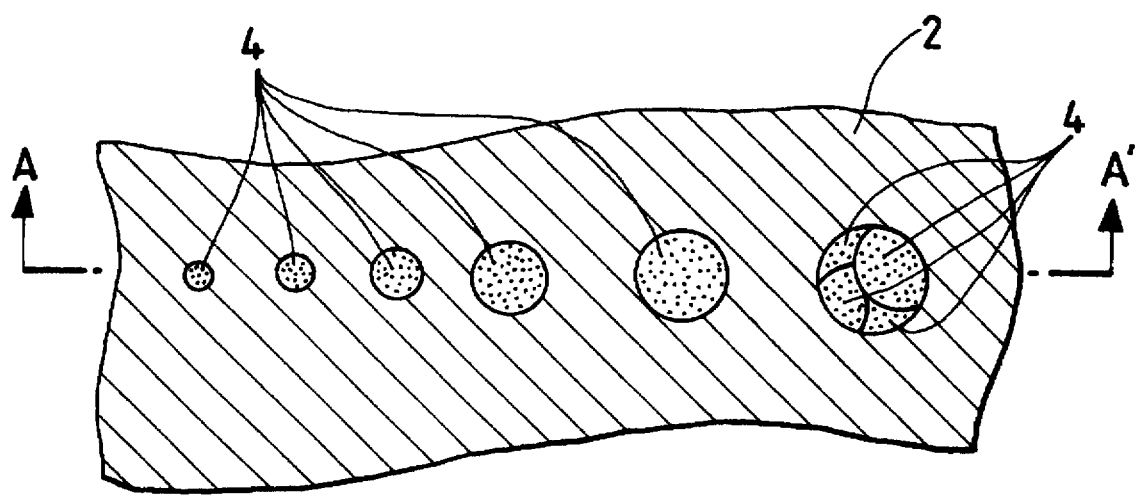
FIGS. 1A and 1B are views illustrating a method of forming crystal nuclei according to the present invention.
Figure 1B:
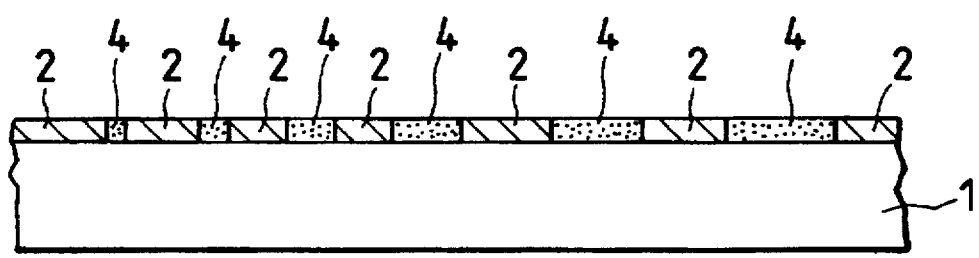

Now, referring to the drawings, an explanation will be given of several embodiments of the present invention.

In the crystallization method according to the present invention, in order to suppress variations in the sizes of crystal grains, the crystal nucleus used for crystallization must include only one crystal grain. Crystallization was executed using several beam diameters to form crystal nuclei. Specifically, an amorphous Si thin film 2 having a thickness of 100 nm deposited on an insulating substrate 1 by the LPCVD technique is successively irradiated with laser beams 3 whose diameters on the substrate are shaped to be about 100 nm, 200 nm, 300 nm, 400 nm, 500 nm and 600 nm by an optical system. When the beam diameter is small, a crystal nucleus 4 includes only one crystal grain. But when the size of the crystal nucleus formed is about 600 nm or larger, it was observed that two or more crystal grains are formed in the area to be a crystal nucleus (FIG. 1A).

The crystal nucleus 4 has a columnar section. Good crystal grains with no substantial crystal defect were formed because of crystallization by laser light energy.

Although not shown, as a result of changing the thickness of the amorphous Si film, it was found that the crystal nucleus which is five times as large as the thickness of the thin film includes plural crystal grains.

From this result, it was found that creation of the crystal nucleus having a size five times as large as the film thickness provides a single crystal grain.

It was found that creation of the crystal nucleus having a diameter substantially equal to the film thickness provides a crystal nucleus with highest uniformity and reliability.

The intervals of forming crystal nuclei are preferably 3 μm or less in view of the crystallization speed of crystal and latent time of nucleus generation in the second crystallizing step.

An explanation will be given of an actual method of forming a poly-Si thin film.

Figure 2A:
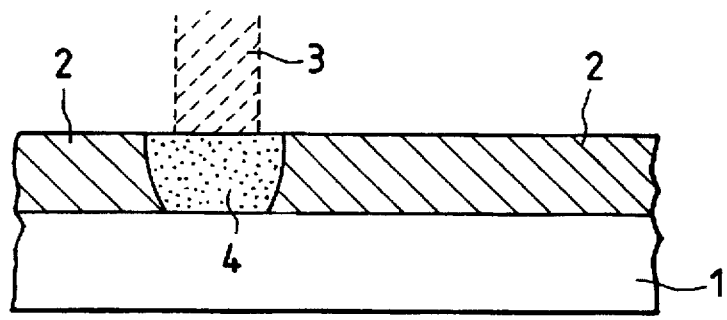
FIGS. 2A to 2D are views illustrating the process of crystallization of semiconductor according to the first embodiment of the present invention.
Figure 2B:
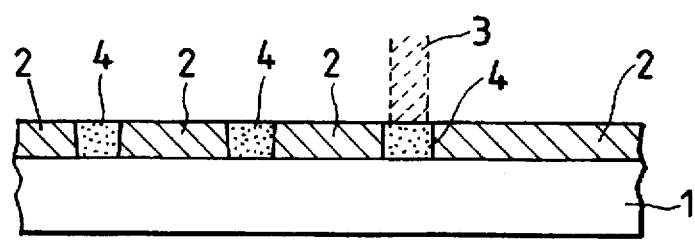

First, as shown in FIG. 2A, by LPCVD, on the surface of an insulating substrate 1 which is an Si substrate with an silicon oxide film deposited thereon, an amorphous Si thin film having a thickness of 100 nm is deposited. By an optical system, the amorphous Si film 2 was irradiated with a laser light beam 3 (laser annealing) which is shaped so as to have a diameter of about 100 nm on the substrate. Since the film thickness is substantially equal to the beam diameter, a crystal nucleus 4 including a single crystal grain was formed in an area irradiated with the beam. The size of the crystal nucleus thus formed was slightly larger than the beam diameter under the influence of heat diffusion.

The amorphous Si thin film 2 was irradiated with the laser light beam in a manner of pulses at intervals of 1 μm to form plural crystal nuclei arranged in dots.

Figure 2C:
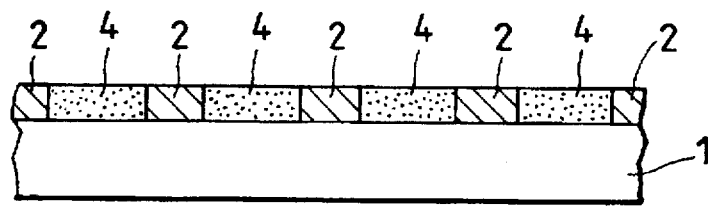

The substrate was heat-treated at 500° C. for 10 hours to make the solid phase crystallization. No other crystal nuclei than the crystal nuclei 4 formed by the laser annealing were not found (FIG. 2C).

Figure 2D:
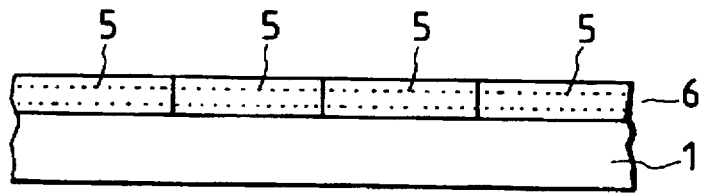

The substrate was further heat-treated at 500° C. for 10 hours. As a result, the grain boundaries at the center between the adjacent crystal nuclei 4 collide with each other to stop the crystallization. Thus, a poly-Si thin film 6 including square-shaped crystal grains 5 having sides of 1 μm was formed (FIG. 2D).

Over the entire substrate, no small crystal grain due to generation of new crystal nuclei were observed. Because of this fact, variations in crystal grain size were as low as 3% or less. Further, because the distance of crystallization is as short as 0.5 μm, a small amount of internal crystal defects such as twin crystal within the crystal grain was found.

An explanation will be given of the second embodiment of the present invention.

Figure 3A:
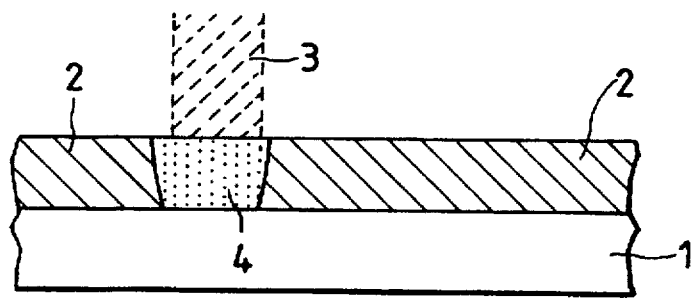
FIGS. 3A to 3E are views illustrating the process of crystallization of semiconductor according to the second embodiment of the present invention.

First, as shown in FIG. 3A, by LPCVD, on the surface of an insulating substrate 1 which is an Si substrate with an silicon oxide film deposited thereon, an amorphous Si thin film having a thickness of 100 nm is deposited. By an optical system, the amorphous Si film 2 is irradiated with a laser light beam 3 (laser annealing) which is shaped so as to have a diameter of about 100 nm on the substrate. Since the film thickness is substantially equal to the beam diameter, as in the first embodiment, a crystal nucleus 4 including a single crystal grain was formed in an area irradiated with the beam. The size of the crystal nucleus thus formed was slightly larger than the beam diameter under the influence of heat diffusion.

Figure 3B:
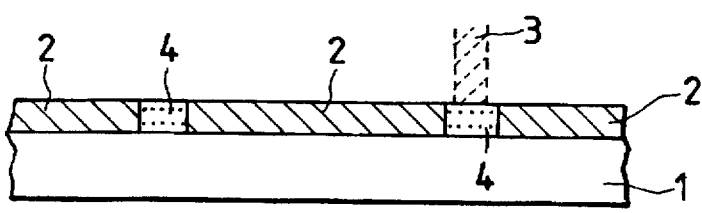

The amorphous Si thin film 2 was irradiated with the laser light beam in a manner of pulses at intervals of 2 μm to form plural crystal nuclei arranged in dots (FIG. 3B).

Figure 3C:
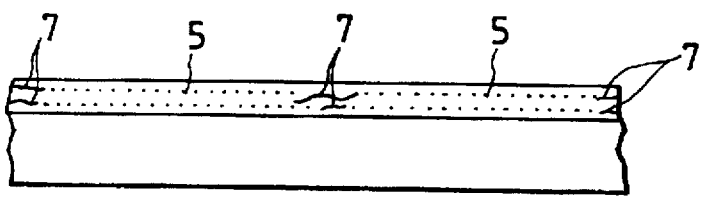

The substrate was heat-treated at 500° C. for 60 hours to make the crystallization. As a result, the grain boundaries at the center between the adjacent crystal nuclei 4 collide with each other to stop the crystal growth. Thus, a poly-Si thin film 6 including square-shaped crystal grains 5 having sides of 2 μm was formed. Some crystal grains were found to contain crystal defects (FIG. 3C). This is probably because defects were induced by stress owing to a long crystallization distance.

Figure 3D:
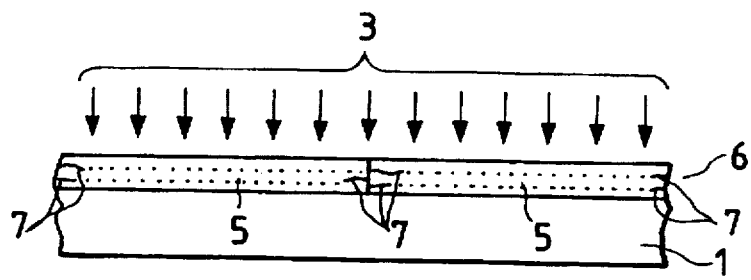

The entire substrate surface was irradiated with the laser light beam 3 having an energy density of 300 mJ/cm$^2$ by a KrF excimer laser (FIG. 3D).

Figure 3E:
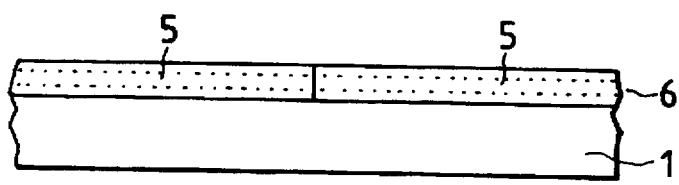

Almost all crystal defects 7 in the periphery of the crystal grains were removed to form a poly-Si thin film 6 (FIG. 3E). Thus, the X-ray diffraction intensity was made larger by about 10% than before the above laser irradiation. This supports improvement of crystallinity due to removal of crystal defects 7.

Over the entire substrate, no small crystal grain due to generation of new crystal nuclei were observed. Because of this fact, variations in crystal grain size were as low as 5% or less.

In the two embodiments described above, since the grain size of the crystal nucleus to be formed was set for about 1 μm, the time required for the crystallization is longer in the second embodiment than in the first embodiment. The longer crystallization time leads to stronger possibility of generating new crystal grains. It was found that the latent time of generating the crystal nucleus at 500° C. was about 100 hours. Therefore, because no crystal nucleus was created before 100 hours elapse, in view of the speed of crystallization, the intervals of crystal nuclei could be increased to 3 μm or so.

In short, in order to crystalize poly-Si thin films which are uniform in shape and size, it was found that the crystal nuclei each having a size 5 times or less as large as the film thickness are formed at intervals of 3 μm or less.

In order to shorten the time of crystal growth, it is efficient to increase the diameter of the crystal nucleus.

An explanation will be given of the third embodiment of the present invention.

In connection with this embodiment, an apparatus for forming a poly-Si thin film will be explained below.

Figure 4A:
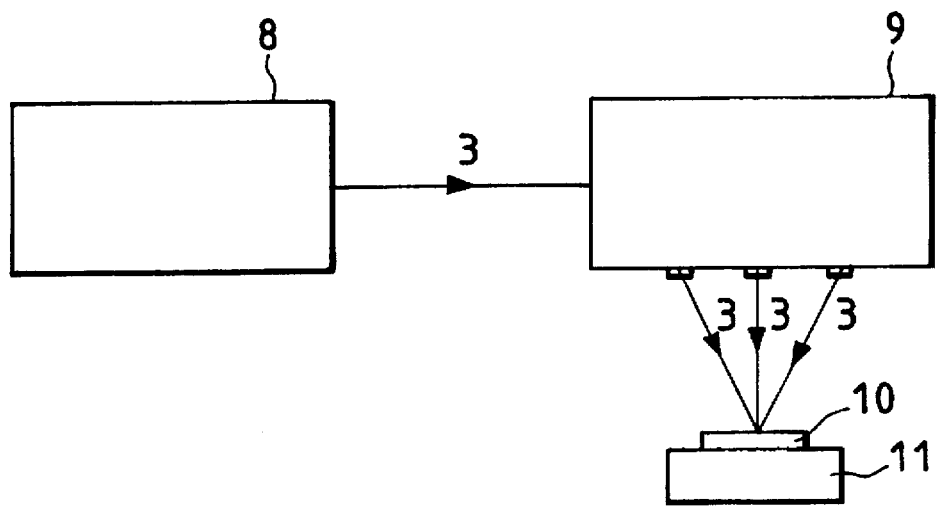
FIGS. 4A and 4B are views showing an apparatus for crystallizing semiconductor in a third embodiment of the present invention.

This apparatus, as shown in FIG. 4, includes a laser device 8 and an optical system 9 for guiding the light from the laser device 8 to a substrate 10. The laser light emitted from the laser device 8 is divided into plural (three in this example) beams by the laser system 9 and emitted so as to converge on the substrate 10 (FIG. 4A).

Figure 4B:
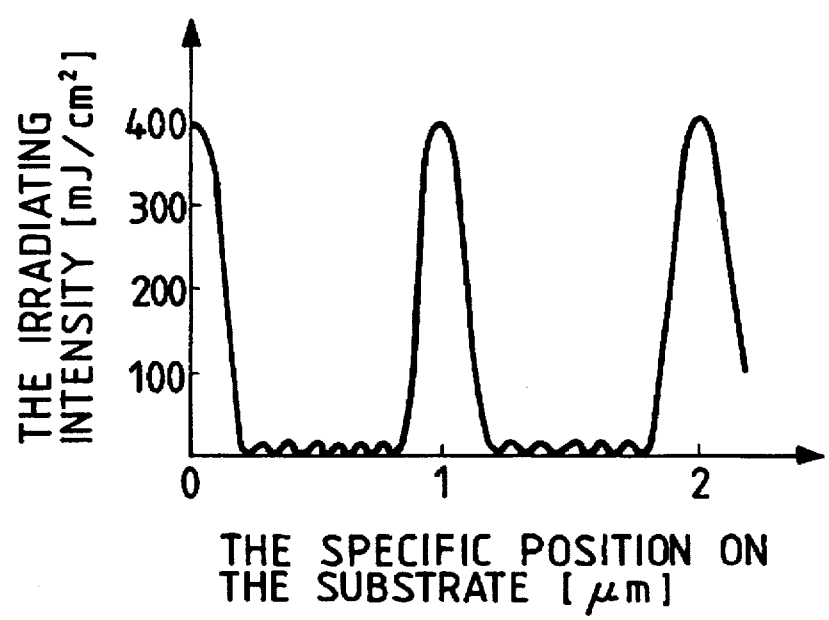

In this case, the plural laser beams 3 interfere with each other so that an interference pattern according to angles among the beams is formed. The irradiating intensity distribution on the substrate has a specific position and intensity distribution according to the angles among the beams so that laser spots can be provided at intervals of 1 μm as shown in FIG. 4B.

Figure 5:
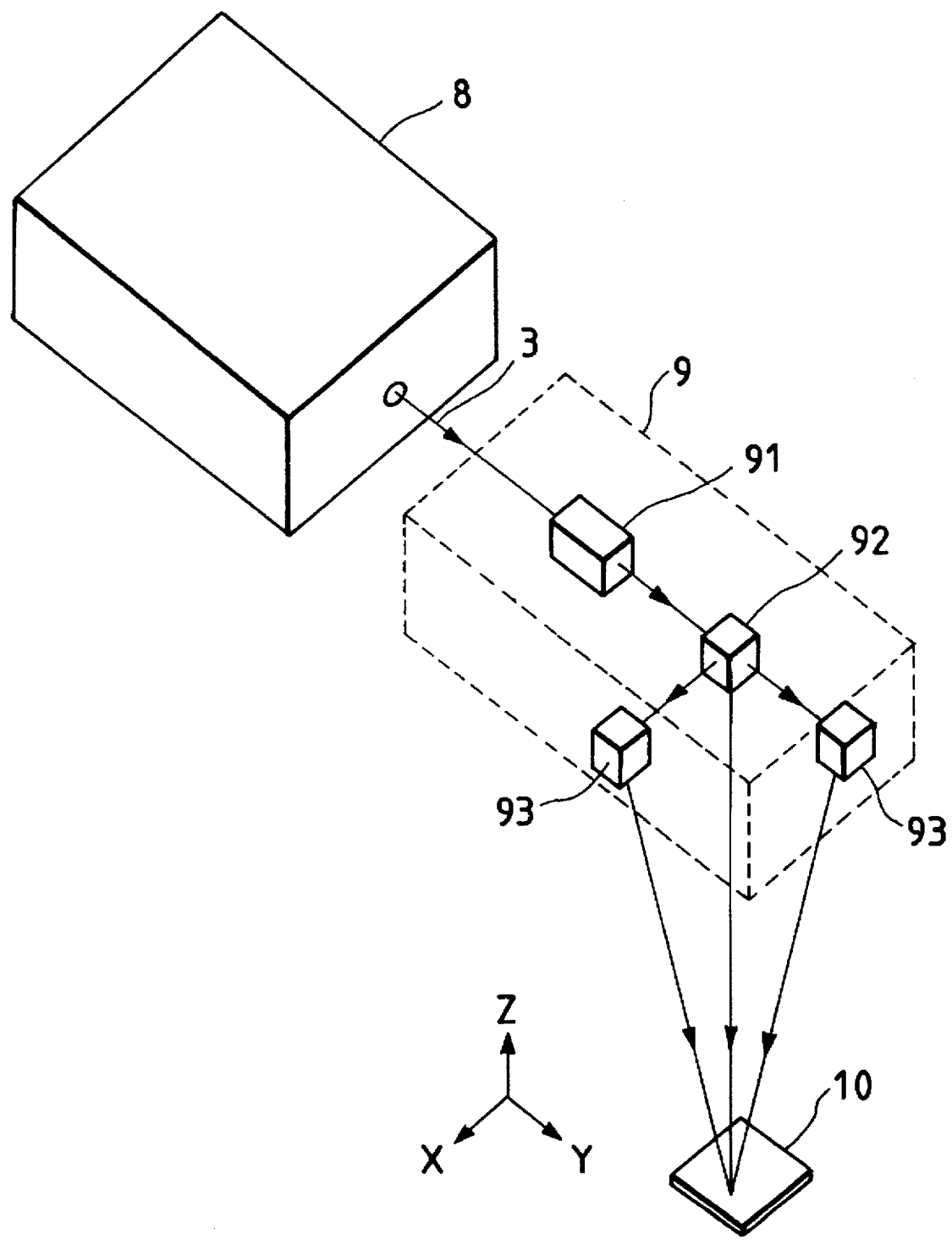
FIG. 5 is a view showing the same apparatus as in FIG. 4.
Figure 6A:
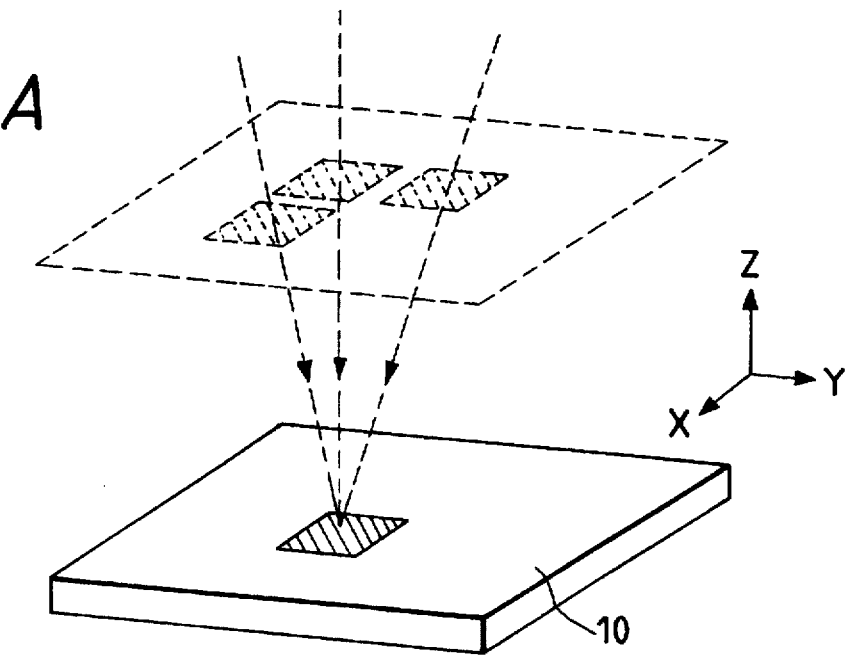
FIGS. 6A and 6B are views illustrating irradiation regions according to the apparatus of FIGS. 4 and 5.
Figure 6B:
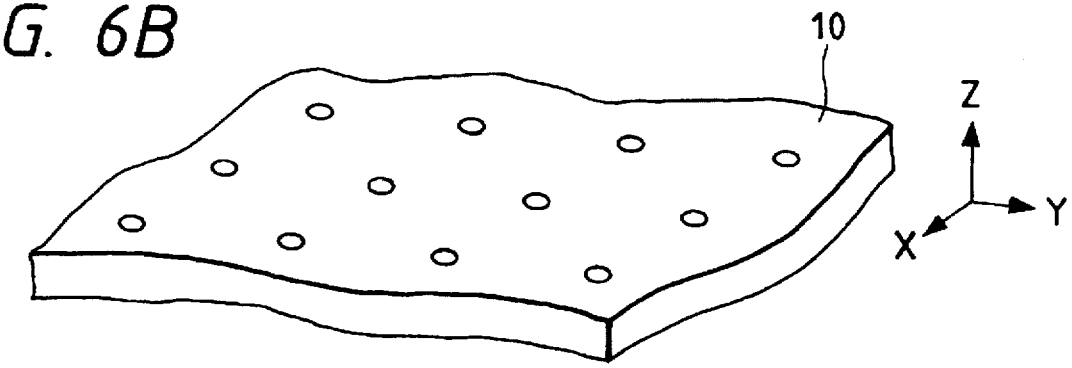

FIG. 5 is a perspective view of such an apparatus. As seen from FIG. 5, the apparatus guides the laser light from a laser oscillator 8 onto the substrate 1 through the optical system 9 including a beam shaping device (homogenizer) 91, a beam splitter 92 and a mirror 93. Moving the position and direction of the mirror 93 can change the angle of irradiation, thereby changing the condition of irradiation such as the interval of irradiation spots. FIG. 6A shows the location of the laser beams in the neighborhood of the substrate at the time of irradiation of laser light, particularly the section of each of the laser beams in a plane in parallel to the substrate 11 and its optical path. FIG. 6B is a partially enlarged view of interference regions of the laser beams. Each of the spot areas corresponds to a crystal area in which a crystal nucleus is created. The size of each of the crystal areas and the interval thereof can be easily adjusted by changing the angle of irradiation of the laser beams so as to change the interference state.

Thus, the use of the interference laser light permits a large number of crystal nuclei to be created simultaneously, thus improving the throughput.

An explanation will be given of the method of forming a poly-Si thin film using the interference laser light.

Figure 7A:
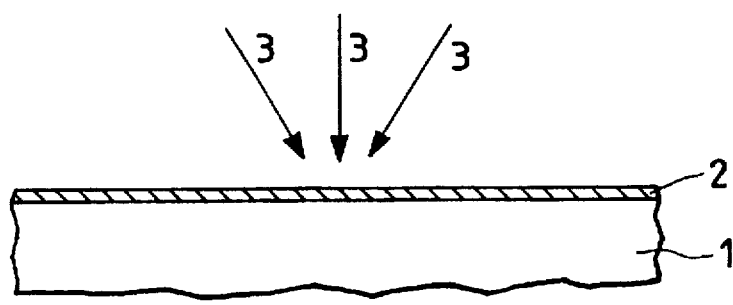
FIGS. 7A to 7D are views illustrating the process of crystallizing semiconductor using the apparatus using the apparatus of FIGS. 4 and 5.
Figure 7B:
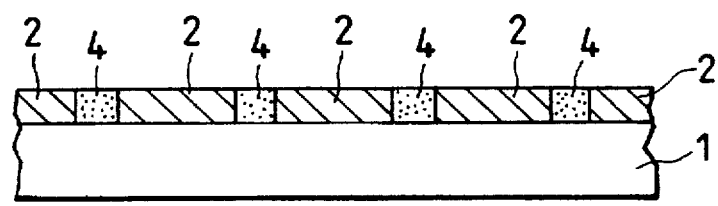

As shown in FIG. 7A, an amorphous Si thin film 2 having a thickness of 100 nm is deposited on an insulating substrate 1 by the LPCVD technique. The amorphous Si thin film 2 is successively irradiated with laser beams 3 whose diameter is about 7 mm and whose shape is substantially square by the KrF excimer laser at the wavelength of 248 nm through an optical system. Then, the optical system divides the incident laser light into three beams. The one beam is in the direction perpendicular to the substrate surface, and the other two beams are in the directions symmetrically inclined by 14° therefrom. These three beams are irradiated so as to converge on the substrate surface. These beams interfered with each other so that the distribution of spots of light intensity were formed at intervals of about 1 µm (FIG. 7B).

Figure 7C:
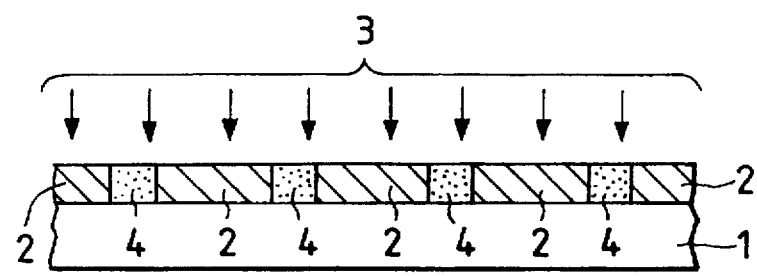
Figure 7D:
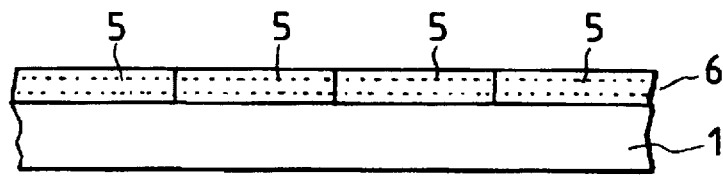

The substrate was irradiated with a KrF laser beam by another optical system (FIG. 7C) in the vertical direction only. Then, in the area irradiated with the beam, crystal nuclei 4 each containing a single crystal grain grow so that a poly-Si thin film 6 composed of square crystal grains 5 each having one side of a length of 1 µm was formed (FIG. 7D). A very small amount of internal crystal defects was contained in each of the crystal grain 5. This should be attributed to the fact that the laser annealing is a solid-phase crystallizing step providing good crystallinity in the crystal grain 5.

Over the entire substrate, no small crystal grain due to generation of new crystal nuclei were observed. Because of this fact, variations in crystal grain size were as low as 3% or less.

In the embodiments described above, although the substrate was not heated, the substrate may be heated during laser irradiation. Heating the substrate retards the cooling speed of Si melted by the laser irradiation so that large crystal grains are easily formed. Crystal nuclei each containing a single crystal grain will be formed more surely. In this case, the substrate heating temperature is desired to be such a temperature that the substrate is not deformed by heat. The heating temperature of a glass substrate whose deformation temperature is generally about 650° C. is desired to be 500° C. or less taking margin into consideration.

Figure 8:
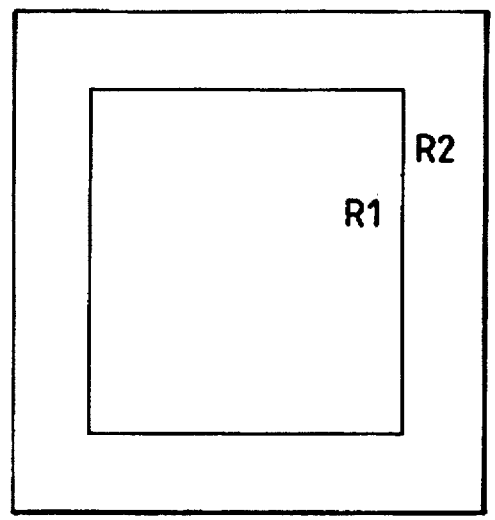
FIG. 8 is a view illustrating semiconductor crystal formed by the fourth embodiment of the present invention.
Figure 9A:
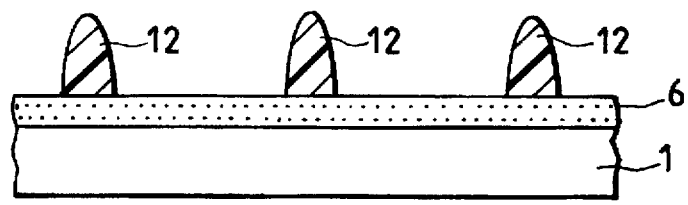
FIGS. 9A to 9C are views showing the process of crystallizing semiconductor according to the prior art.
Figure 9B:
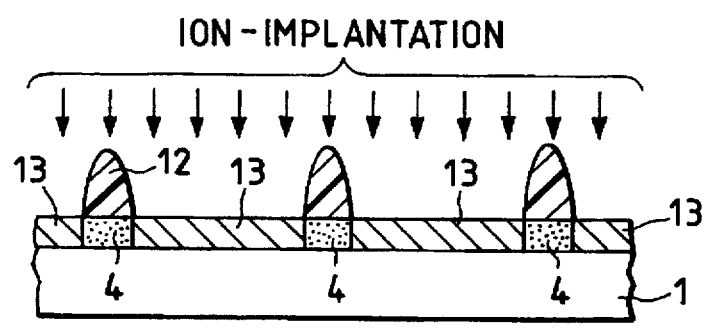
Figure 9C:
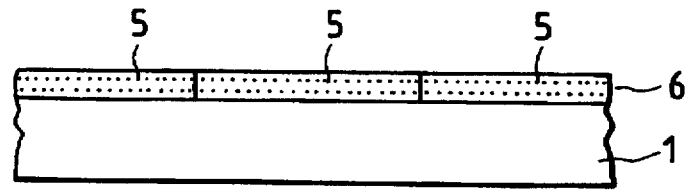
Figure 10A:
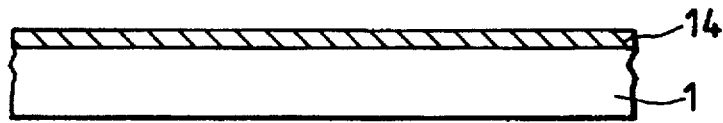
FIGS. 10A to 10D are views showing the process of crystallizing semiconductor according to the prior art.
Figure 10B:
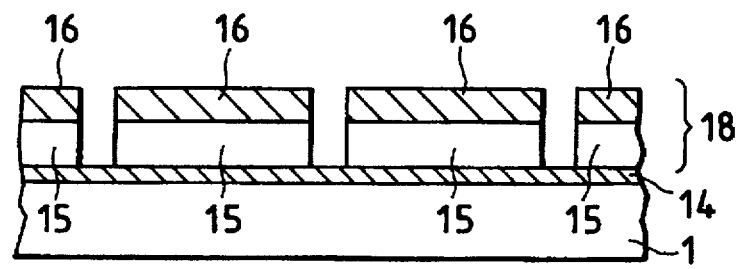
Figure 10C:
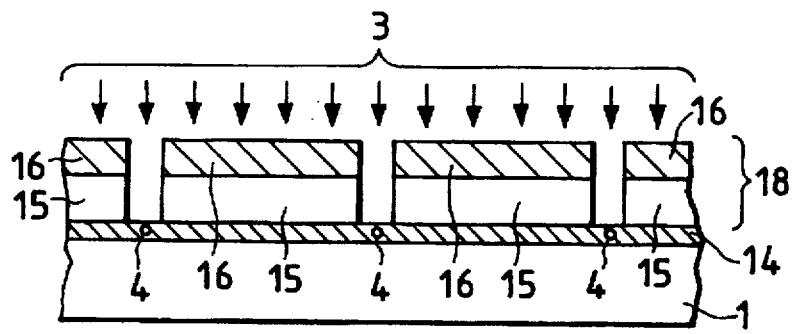
Figure 10D:
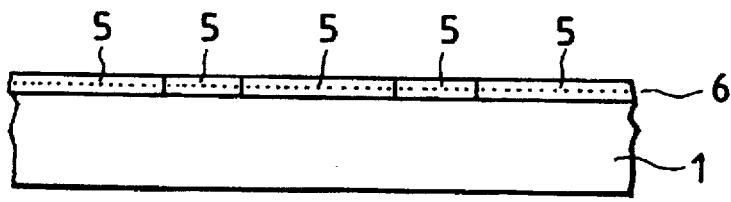
Figure 11A:
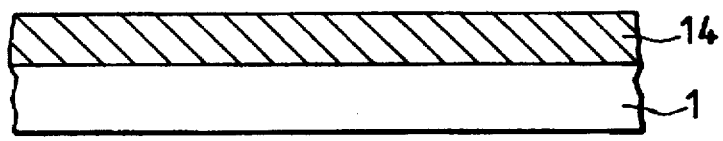
FIGS. 11A to 11E are views showing the process of crystallizing semiconductor according to the prior art.
Figure 11B:
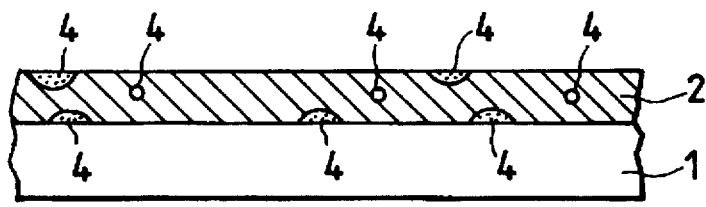
Figure 11C:
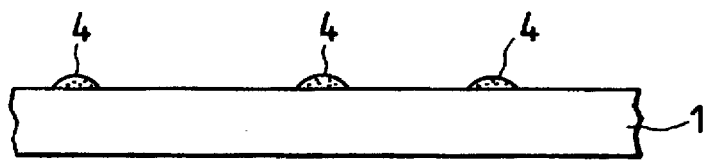
Figure 11D:
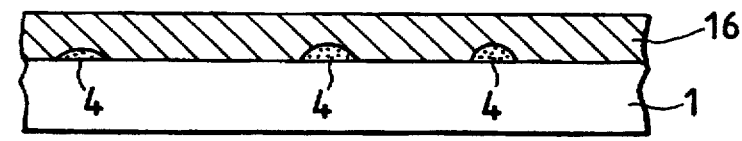
Figure 11E:
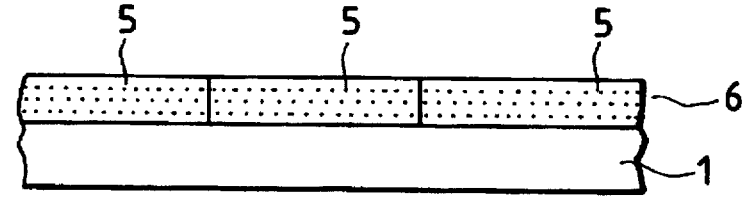
Figure 12A:
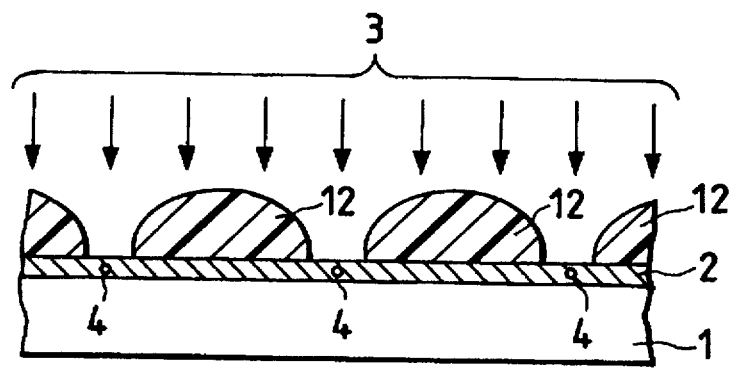
FIGS. 12A to 12D are views showing the process of crystallizing semiconductor according to the prior art.
Figure 12B:
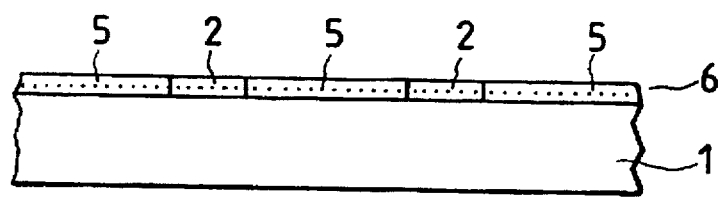
Figure 12C:
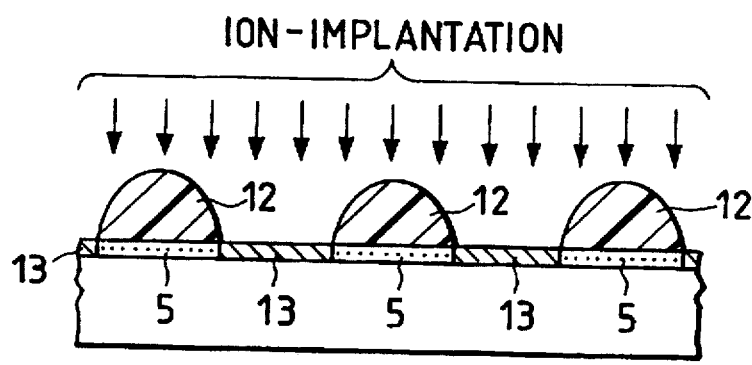
Figure 12D:
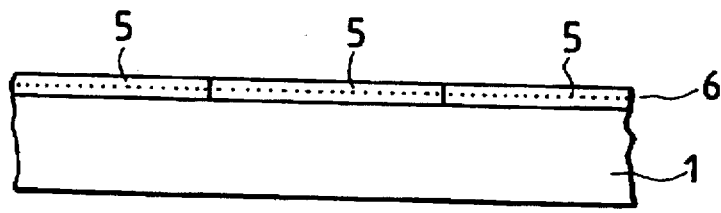
Figure 13A:
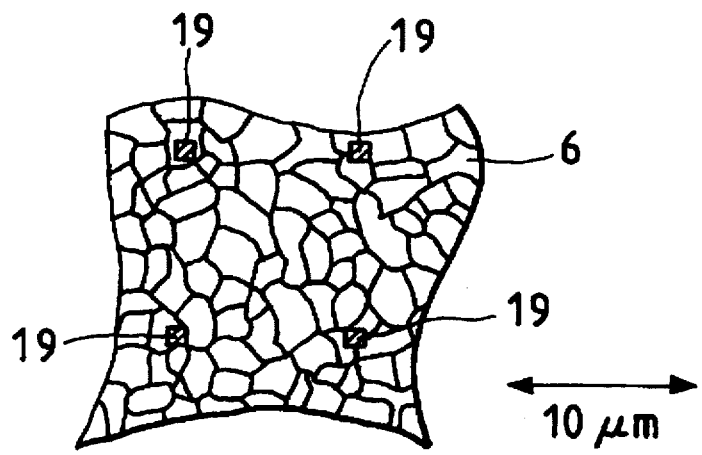
FIGS. 13A and 13B are views showing semiconductor crystal and semiconductor device fabricated by the prior art.
Figure 13B:
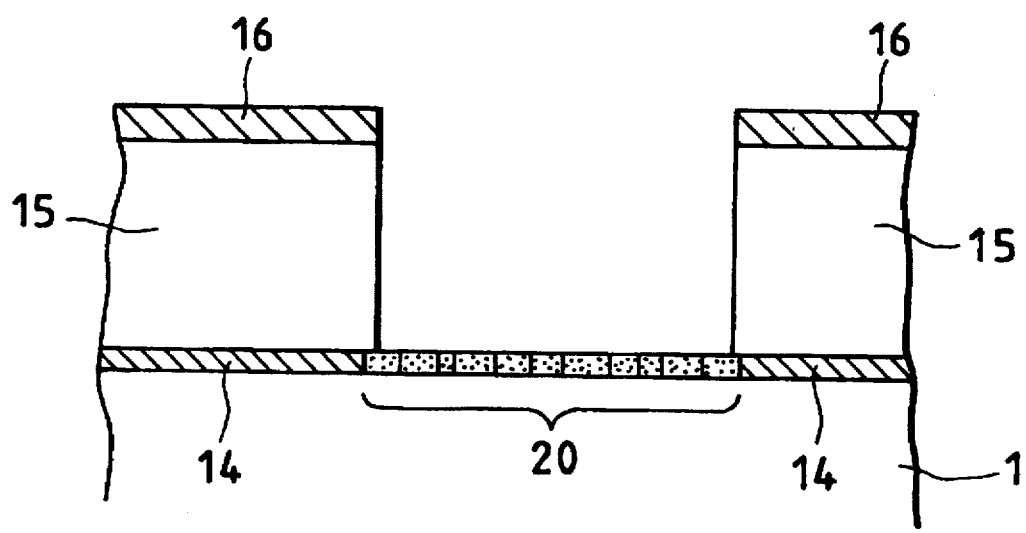

Further, in the embodiments described above, in the first step of forming crystal nuclei, the crystal areas having the same diameter were formed at regular intervals on the entire surface to form a poly-Si layer with uniform grain sizes over the substrate surface. But, in a fourth embodiment of the present invention, with grain sizes corresponding to kinds of the devices formed in areas R1 and R2, as shown in FIG. 8, poly-Si layers with different grain sizes may be formed in the different areas.

The steps and their order adopted in the previous embodiments may be changed. In order to deposit the amorphous Si, for example, plasma CVD, ECR-CVD, sputtering and evaporation may be used. Without being limited to Si, the present invention may be applied to other semiconductors such as SiC, GaAs, InP and a diamond thin film. In this case, the laser must be selected taking the band gap of material and absorption coefficient. Further, the laser may be other excimer lasers such as XeCl, ArF and XeF, other pulse lasers, continuous oscillation, electronic beam infrared lamp or ultraviolet lamp may be adopted.

For the purpose of spot irradiation due to interference of laser beams, techniques of using a mask having regular openings and superposing laser beams from plural laser devices may be used. In this case, the openings of the mask have square, triangular and other optional individual patterns, otherwise linear patterns such as a straight line or curved line having a width and interval suitable to interference may be adopted. Namely, the pattern may be determined in accordance with the size and interval of necessary crystal nuclei. The angles of plural beams should not be limited to those in the embodiments described above, but may be set in accordance with the arrangement of necessary crystal nuclei. Interference light may be produced by other methods.

The interval of crystal nuclei is not required to be equal to each other. With different intervals for areas changed so as to satisfy the characteristic of a device to be formed, a group of crystal grains having different sizes may be obtained.

As described above, the present invention can provide a poly-Si film with improved uniformity of film quality and high production yield.

What is claimed is:

1. A method of semiconductor crystallization, comprising:
   a characteristic determining step of applying by an optical system a first crystallizing energy to plural loci of an amorphous semiconductor thin film to form a single crystal nucleus in at least one locus of said plural loci said loci being at intervals to determine a size of an area so as to form a single crystal on the area, said optical system providing to said thin film, multiple beams of laser light having a spacial intensity distribution shaped by interference;
   a film forming step of forming an amorphous semiconductor thin film on a surface of a substrate; and
   a crystallizing step of applying a second crystallizing energy to said amorphous semiconductor thin film to grow the crystal of said amorphous semiconductor thin film from the crystal nucleus formed by said first crystallizing energy step.

2. A method of semiconductor crystallization, comprising:
   a characteristic determining step of applying by an optical system a first crystallizing energy to plural loci of an amorphous semiconductor thin film to form a single crystal nucleus in at least one locus of said plural loci, said loci being at intervals to determine a size of an area so as to form a single crystal on the area;
   a film forming step of forming an amorphous semiconductor thin film on a surface of a substrate; and
   a crystallizing step of applying a second crystallizing energy to said amorphous semiconductor thin film to grow the crystal of said amorphous semiconductor thin film from the crystal nucleus formed by said first crystallizing energy step;
   wherein the grain size of each crystal nucleus formed by said first crystallizing energy step is 0.5 to 5 times as large as the thickness of said amorphous semiconductor thin form, and the interval of said loci to which said first crystallizing energy is applied is 3 µm or less.

3. A method of semiconductor crystallization of claim 1, wherein said first crystallizing energy is laser light energy.

4. A method of semiconductor crystallization of claim 1, wherein said second crystallizing step is performed by irradiation of energy light.

5. A method of semiconductor crystallization of claim 1, wherein said second step is a solid-state growth step by heat treatment.

6. A method of semiconductor crystallization of claim 1, wherein said second crystallizing step, includes:

a solid crystallization step by heat treatment; and an irradiation step of energy light.

7. A method of semiconductor crystallization, comprising:

a film forming step of forming amorphous semiconductor thin film on a surface of a substrate;

a first step of applying by an optical system a first crystallizing energy to said amorphous semiconductor thin film to form crystal nuclei, said optical system providing to said thin film, multiple beams of laser light having a spacial intensity distribution shaped by interference;

a second step of applying a second crystallizing energy to said amorphous semiconductor thin film to grow a crystal of said amorphous semiconductor thin film, wherein said first step consists of applying the first crystallization energy to form the crystal nuclei at desired different intervals on said amorphous semiconductor thin film, and said second step consists of applying the second crystallization energy to grow semiconductor crystals from the crystal nuclei having different sizes formed by said first step wherein said semiconductor crystals having different crystal grain sizes are formed.

8. A method according to claim 7, wherein the crystal nuclei have different grain sizes.

9. A method according to claim 1, wherein the substrate surface is not contacted by a mask.

10. A method according to claim 2, wherein the substrate surface is not contacted by a mask.

11. A method according to claim 7, wherein the substrate surface is not contacted by a mask.

12. A method of semiconductor crystallization according to claim 1, wherein grain size of each crystal nucleus formed by said first crystallizing energy step is 0.5 to 5 times as large as the thickness of said amorphous semiconductor thin film, and the interval of said loci to which said first crystallizing energy is applied is 3 µm or less.

13. A method according claim 2, wherein said method does not comprise an ion-implantation step.

* * * * *